United States Patent
Tateyama

[11] Patent Number: 6,062,288
[45] Date of Patent: May 16, 2000

[54] PROCESSING APPARATUS

[75] Inventor: Kiyohisa Tateyama, Kumamoto, Japan

[73] Assignee: Tokyo Electron Limited, Japan

[21] Appl. No.: 09/061,231

[22] Filed: Apr. 16, 1998

[30] Foreign Application Priority Data

Apr. 28, 1997 [JP] Japan .................................. P9-122795

[51] Int. Cl.[7] .................................................. B32B 35/00
[52] U.S. Cl. ............................ 156/584; 118/316; 134/72; 216/92
[58] Field of Search ................................ 134/72; 216/92; 118/316, 323; 156/344, 584

[56] References Cited

U.S. PATENT DOCUMENTS

| | | | |
|---|---|---|---|
| 5,688,411 | 11/1997 | Kutsuzawa et al. | 216/92 |
| 5,718,763 | 2/1998 | Tateyama et al. | 118/52 |
| 5,904,164 | 5/1999 | Wagner et al. | 134/148 |
| 5,952,050 | 9/1999 | Doan | 427/336 |

FOREIGN PATENT DOCUMENTS

| | | | |
|---|---|---|---|
| 2-157763 | 6/1990 | Japan | 156/584 |
| 5-114555 | 5/1993 | Japan . | |

*Primary Examiner*—Mark A. Osele
*Attorney, Agent, or Firm*—Rader, Fishman & Grauer; Monica E. Millner

[57] ABSTRACT

A processing apparatus, which removes a processing agent adhered to an peripheral portion of a substrate on which the processing agent is coated, comprises a nozzle having a recess portion into which the peripheral portion of the substrate is inserted and for supplying a solvent to the peripheral portion of the substrate which has been inserted into the recess portion, a moving mechanism for moving the nozzle along the peripheral portion of the substrate, and rotating bodies for guiding the peripheral portion of the substrate to an inlet of the recess portion of the nozzle, whereby the processing agent on the peripheral portion of the substrate can be removed by the solvent which has been supplied to the peripheral portion of the substrate.

15 Claims, 10 Drawing Sheets

PROCESSING APPARATUS

BACKGROUND OF THE INVENTION

1. Field of the Invention

The present invention relates to a processing apparatus for removing a processing agent from a peripheral portion of a substrate such as an LCD substrate, a semiconductor wafer, etc.

2. Description of the Related Art

In the manufacturing process of liquid crystal display (LCD), semiconductor device, etc., so-called lithography process is executed to form resist film patterns on an upper surface of an LCD substrate or a semiconductor wafer serving as a substrate. The lithography process includes various process steps such as substrate cleaning, substrate drying, resist coating on a substrate surface, exposure/development of a photosensitive film, etc. For instance, after the substrate has been cleaned, hydrophobicity process is executed and, after the substrate has been cooled, a photosensitive film is formed on a surface of the substrate by coating the resist as photoresist. Then, after baking process has been applied by heating the substrate, predetermined patterns are exposed on the photosensitive film by the exposure unit, then a liquid developer is coated/developed on the surface of the substrate which has been subjected to the exposure process, and then the liquid developer is rinsed by a rinsing solution, whereby the developing process has been completed.

In the above lithography process, a spin coating method, a spray method, etc. have been employed as resist coating process. If the resist is coated according to these methods, a film thickness is uniform immediately after coating, nevertheless the resist becomes thick like a risen portion on the peripheral portion of the substrate due to an influence of a surface tension after a centrifugal force has not operated because of stop of rotation or as the time has lapsed. In addition, there are some cases where the resist which is taken out by rotation is scattered onto a back surface of the substrate to thus adhere to unnecessary areas thereof. Like this, the resist which has been adhered to either the nonuniform thickness portion formed on the peripheral portion of the substrate or the back surface of the substrate would cause generation of particles during carrying process of the substrate, etc. In addition, such resist also causes contamination of carrying units for carrying the substrate.

In the prior art, after the resist has been coated on the substrate by the coating unit, the substrate is transferred to a removing unit wherein unnecessary resist adhered on the peripheral portion of the substrate is removed. In the removing unit, nozzle heads which have their recess portions for injecting the solvent from their insides are provided. The peripheral portion of the substrate is inserted into the recess portions via their clearances. Then, while moving the recess portions along the peripheral portion of the substrate, the solvent is injected from the inside of the recess portions to upper and lower surfaces of the peripheral portion of the substrate to melt the unnecessary resist and then such resist is sucked to be removed outside.

However, since only a central area of the above substrate can be held on a loading table by virtue of vacuum suction but the peripheral portion of the substrate acts as a free end, bowing of the peripheral portion of the substrate occurs after the substrate has been subjected to thermal treatment, etc. As a consequence, there have been some cases where the substrate cannot be inserted into the recess portion because bowed peripheral portion of the substrate strikes against an inlet of the recess portion of the nozzle main body of the above removing unit.

In such case, it may be considered that insertion of the peripheral portion of the substrate can be facilitated by enlarging a clearance of the recess portion. However, if the clearance of the recess portion is enlarged, the solvent being injected from the inside of the recess portion becomes difficult to be sprayed onto the resist, so that an efficiency in removing the resist is reduced. Therefore, it is not preferable to enlarge the clearance of the recess portion.

Besides, it may be thought of that vacuum suction of the substrate should be applied from the central area to the peripheral area of the substrate on the loading table to prevent the bowing of the substrate. However, if the peripheral portion of the substrate placed on the loading table is sucked by vacuum, it is likely that, when the substrate on the loading table is transferred from the loading table to a main arm used to pass the substrate to various processor units, the loading table would interfere with such main arm. As a result, it is evident that vacuum suction extending up to the peripheral portion of the substrate would not preferable.

In the meanwhile, according to kinds of the resist, there have been some cases where the resist on the peripheral portion of the substrate cannot be perfectly removed only by supplying the solvent to the resist. In the prior art, it has been requested to take a countermeasure against such case.

SUMMARY OF THE INVENTION

It is an object of the present invention to provide a processing apparatus which enables a substrate to be easily inserted into a recess portion of a nozzle main body for injecting a solvent even if a bowing is caused on a peripheral portion of the substrate.

It is another object of the present invention to provide a processing apparatus capable of removing sufficiently resist formed on the peripheral portion of the substrate.

According to a first aspect of the present invention, there is provided a processing system for removing a processing agent adhered to an peripheral portion of a substrate on which the processing agent is coated, comprising:

a nozzle having a recess portion into which the peripheral portion of the substrate is inserted, and for supplying a solvent to the peripheral portion of the substrate which has been inserted into the recess portion;

a moving mechanism for moving the nozzle along the peripheral portion of the substrate; and a guiding means for guiding the peripheral portion of the substrate to an inlet of the recess portion of the nozzle, whereby the processing agent on the peripheral portion of the substrate can be removed by the solvent which has been supplied to the peripheral portion of the substrate.

In this manner, since the guiding means which can guide the peripheral portion of the substrate to the inlet of the recess portion of the nozzle is provided, the substrate can be easily inserted into the recess portion of the nozzle means which supplies the solvent to the peripheral portion of the substrate even when the bowing of the peripheral portion of the substrate is caused.

In this case, the guiding means may have rotating bodies which are arranged on the inlet of the recess portion. Normally it is not preferable that the substrate on which the processing agent has been coated should be brought into contact with unnecessary things. Thus, unnecessary contact with the substrate can be avoided by providing the rotating bodies, e.g., the rollers as the guiding means.

In addition, the cleaning spray holes for injecting the solvent to the rotating bodies can be arranged in the vicinity of the rotating bodies. Accordingly, the melted processing agent can be prevented from adhering to the rollers, and thus never exerts bad influence on the substrate.

According to a second aspect of the present invention, there is provided a processing system for removing a processing agent adhered to an peripheral portion of a substrate on which the processing agent is coated, comprising:

a nozzle having a recess portion into which the peripheral portion of the substrate is inserted, and for supplying a solvent to the peripheral portion of the substrate which has been inserted into the recess portion;

a moving mechanism for moving the nozzle along the peripheral portion of the substrate; and a removing means provided in the recess portion of the nozzle, for scraping off the processing agent which is adhered to an end surface and its neighboring area of the substrate when it is brought into contact with the end surface of the substrate.

In this manner, since the removing member which can contact to the end surface of the substrate to scrape off the processing agent adhered to the end surface of the substrate and its neighborhood is provided in the recess portion of the nozzle, the processing agent which is still fixed to the peripheral portion of the substrate even when the solvent is supplied thereto can be sufficiently removed.

In this case, the removing member having the plate spring which can apply the energizing force when the end surface of the substrate comes into contact therewith can be employed, whereby the removing member can always push the end surface of the substrate. Accordingly, the processing agent which has adhered to the peripheral portion of the substrate can be removed by the removing member without fail. Further, an excessive force can not be applied to the substrate without displacement of the substrate. Furthermore, if a number of holes are formed on the surface of the plate spring, the processing agent can be removed effectively by such holed portions, and the processing agent can be prevented from being deposited on the plate spring, etc. by sucking the solvent and the processing agent via the holes. In addition, if the aggregate of metal wires is employed as the removing member, the processing agent which has been adhered to the peripheral portion of the substrate can be scraped off effectively by convex portion of the metal wires. In this case, it is also effective to provide the guiding means which can guide the peripheral portion of the substrate to the inlet of the recess portion of the nozzle.

DETAILED DESCRIPTION OF THE PREFERRED EMBODIMENTS

Embodiments of the present invention will be explained in detail with reference to the accompanying drawings hereinafter.

Figure 1:
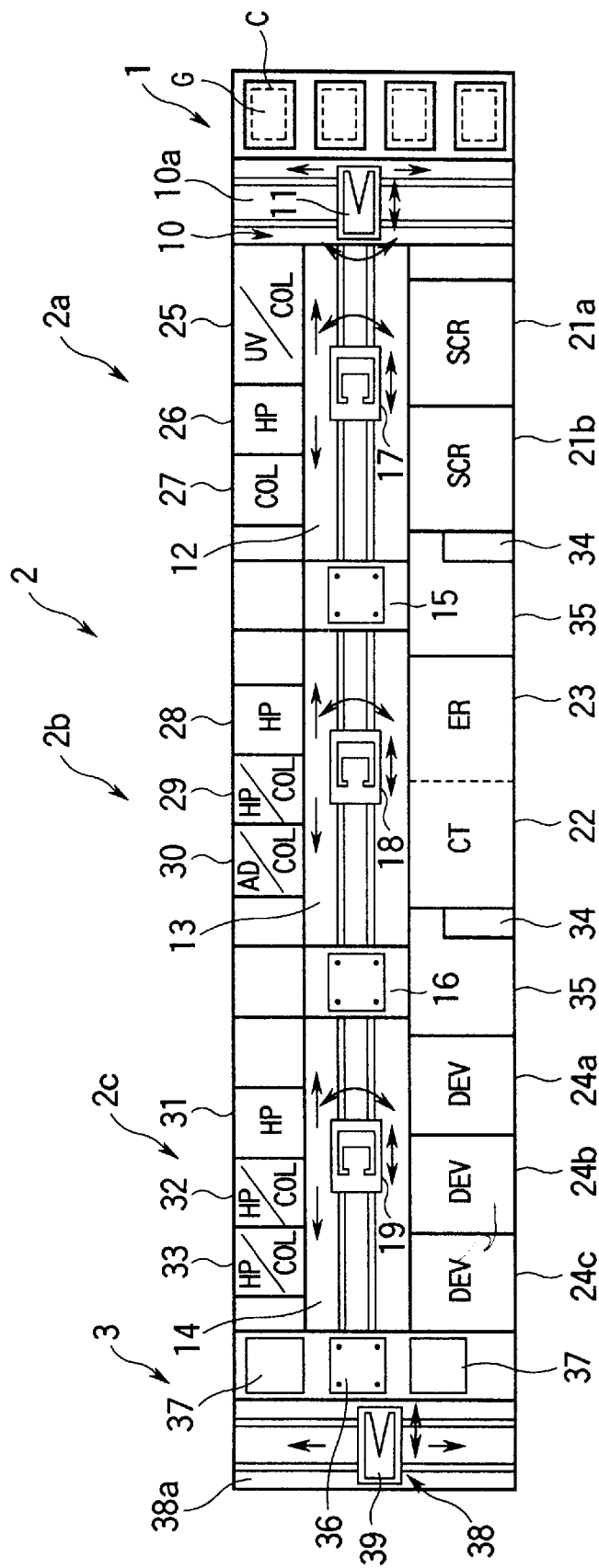
FIG. 1 is a plan view showing a resist coating/developing process system to which a processing apparatus according to the present invention is applied.

FIG. 1 is a plan view showing an LCD substrate coating/developing process system to which the present invention is applied.

This coating/developing process system comprises a cassette station 1 in which a cassette C to incorporate a plurality of substrates G therein is loaded, a processor portion 2 including a plurality of processing units which apply a series of processes including coating/developing of resist to the substrates G, and an interface portion 3 for transferring the substrate G between the coating/developing process system and an exposure unit (not shown). The cassette station 1 and the interface portion 3 are provided to both ends of the processor portion 2 respectively.

The cassette station 1 comprises a carrying mechanism 10 for carrying an LCD substrate between the cassette C and the processor portion 2. Loading/unloading the cassette C into/from the cassette station 1 is then carried out. In addition, the carrying mechanism 10 comprises carrying arms 11 which are movable on carrying paths 10a provided along an alignment direction of the cassettes, and the substrate G can be carried between the cassette C and the processor portion 2 by virtue of the carrying arms 11.

The processor portion 2 is divided into a front stage portion 2a, an intermediate stage portion 2b, and a rear stage portion 2c, in which carrying paths 12, 13, 14 are provided in their central areas respectively and processing units are arranged on both sides of these carrying paths respectively. Relay portions 15, 16 are provided between the front stage portion 2a, the intermediate stage portion 2b, and the rear stage portion 2c respectively.

The front stage portion 2a comprises a main carrying unit 17 which is movable along the carrying path 12. Two cleaning units (SCR) 21a, 21b are provided to one end side of the carrying path 12, while a ultraviolet irradiating/ cooling unit (UV/COL) 25 and a heating process unit (HP) 26 and a cooling unit (COL) 27, both being stacked as two upper and lower stages respectively, are provided to the other end side of the carrying path 12.

Then, the intermediate stage portion 2b comprises a main carrying unit 18 which is movable along the carrying path 13. A resist coating process unit (CT) 22 and a peripheral resist removing unit (ER) 23 which can remove the resist on the peripheral portion of the substrate G are provided integrally to one end side of the carrying path 13, whereas heating process units (HP) 28 which are stacked as two stages vertically, a heating/cooling process unit (HP/COL) 29, in which the heating process unit and the cooling process unit are stacked vertically, and an adhesion/cooling process unit (AD/COL) 30, in which an adhesion process unit and a cooling unit are stacked vertically, are provided to the other end side of the carrying path 13.

In addition, the rear stage portion 2c comprises a main carrying unit 19 which is movable along the carrying path 14. Three developing process units 24a, 24b, 24c are provided to one end side of the carrying path 14, while heating process units 26, which are stacked as two stages vertically, and two heating/cooling process units (HP/COL) 32, 33, in which a heating process unit and a cooling process unit are vertically stacked respectively, are provided to the other end side of the carrying path 14.

The processor portion 2 is so constructed that spinner system units such as a cleaning process unit 21a, a resist process unit 22a, a developing process unit 24a, etc. are arranged on one side of the carrying path, while only thermal system process units such as the heating process unit, the cooling process unit, etc. are arranged on the other side of the carrying path.

The main carrying units 17, 18, 19 comprise an X-axis driving mechanism and a Y-axis driving mechanism in two horizontal directions of a horizontal surface and a Z-axis driving mechanism in the vertical direction respectively, and comprises a rotation driving mechanism for driving around the Z-axis.

The main carrying unit 17 has functions of transferring/ receiving the substrate G to/from the arms 11 of the carrying mechanism 10, and loading/unloading the substrate G into/ from respective process units in the front stage portion 2a, and transferring/receiving the substrate G to/from the relay unit 15. Also, the main carrying unit 18 has functions of transferring/receiving the substrate G to/from the relay unit 15, and loading/unloading the substrate G into/from respective process units in the intermediate stage portion 2b, and transferring/receiving the substrate G to/from the relay unit 16. In addition, the main carrying unit 19 has functions of transferring/receiving the substrate G to/from the relay unit 16, loading/unloading the substrate G into/from respective process units in the rear stage portion 2c, and transferring/ receiving the substrate G to/from the interface portion 3. The relay units 15, 16 can also act as a cooling plate respectively.

The interface portion 3 comprises an extension 36 for holding the substrate temporarily when the substrate is transferred/received to/from the processor portion 2, two buffer stages 37 which are provided on both sides of the extension 36 and in which buffer cassettes are arranged, and a carrying mechanism 38 for carrying the substrate G between the extension 36/two buffer stages 37 and an exposure unit (not shown). The carrying mechanism 38 includes a carrying arm 39 which is movable on carrying paths 38a provided along the alignment direction of the extension 36 and the buffer stages 37. The substrate G can be carried between the processor portion 2 and the exposure unit by the carrying arm 39.

Like the above, space saving and improvement in the efficiency of the process can be achieved by incorporating respective process units together.

In the coating/developing process system as constructed above, the substrate G in the cassette C is carried into the processor portion 2. Then, in the processor portion 2, first the substrate G is subjected to surface modifying/cleaning process in the ultraviolet irradiating/cooling unit (UV/COL) 25 and then to scriber cleaning process in the cleaning units (SCR) 21a, 21b after the substrate has been cooled, then is dried by heating operation in the heating process unit (HP) 26, and then is cooled in the cooling unit (COL) 27.

After this, the substrate G is carried to the intermediate stage portion 2b and then to hydrophobicity process (HMDS process) in the upper stage adhesion process unit (AD) of the unit 30 in order to enhance a fixing property of the resist. Then, the substrate G is cooled in the cooling unit (COL) and then coated with the resist in- the resist coating unit (CT) 22. Then, extra resist on the peripheral portion of the substrate G is removed in the peripheral resist removing unit (ER) 23. Then, the subject G is subjected to prebake process in the heating process unit (HP) in the intermediate stage portion 2b and then is cooled in the lower stage cooling unit (COL) in the unit 29 or 30.

Thereafter, the substrate G is carried by the main carrying unit 19 from the relay portion 16 to the exposure unit via the interface portion 3, and then predetermined patterns are exposed on the substrate G. Then, the substrate G is carried again via the interface portion 3 and then is developed in any of the developing process units (DEV) 24a, 24b, 24c to form predetermined patterns thereon. The developed substrate G is subjected to postbake process in any of the heating process unit (HP), then is cooled in the cooling unit (COL), and then is put in the predetermined cassette on the cassette station 1 by virtue of the main carrying units 19, 18, 17 and the carrying mechanism 10.

Figure 2:
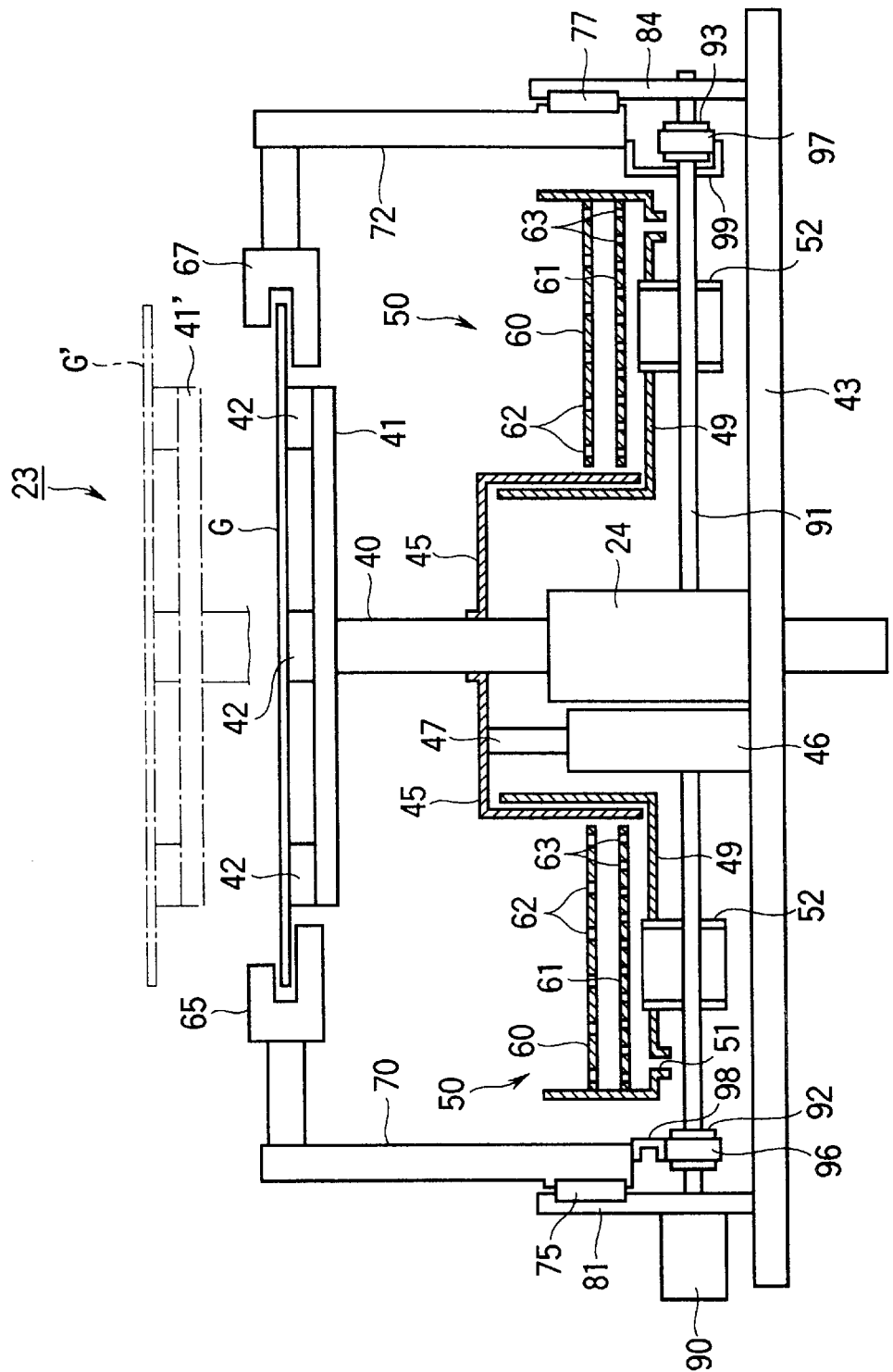
FIG. 2 is a front view showing a peripheral resist removing unit according to an embodiment of the processing apparatus of the present invention.
Figure 3:
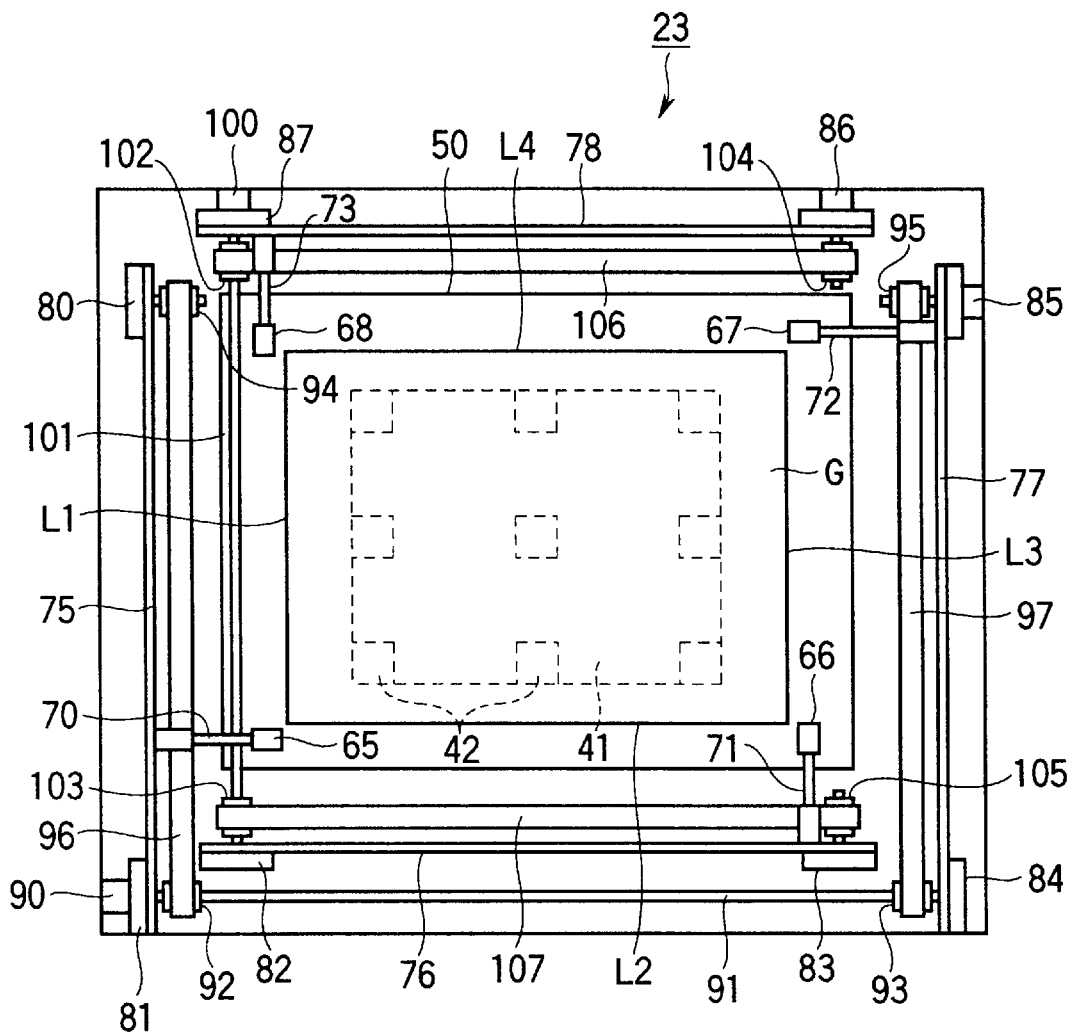
FIG. 3 is a plan view showing the peripheral resist removing unit shown in FIG. 2.

In turn, the peripheral resist removing unit (ER) 23 will be explained in detail hereunder. As shown in FIGS. 2 and 3, a loading table 41 supported on an upper end of a strut 40 is arranged in the central area of the peripheral resist removing unit (ER) 23. A plurality of suction members 42 are provided on an upper surface of the loading table 41. The substrate G can be held on the upper surface of the loading table 41 when the suction members 42 attract a lower surface of the substrate G.

A lower end of the strut 40 passes through a bearing 44 fixed on an system frame 43. The loading table 41 is supported vertically movably by sliding the strut 40 in the bearing 44. However, since a piston rod 47 of a cylinder 46 which is fixed to the system frame 43 is connected to a cover body 45 which is attached in the middle of the strut 40, the loading table 41 can be moved vertically in compliance with a forward/backward movement of the piston 47.

Figure 4:
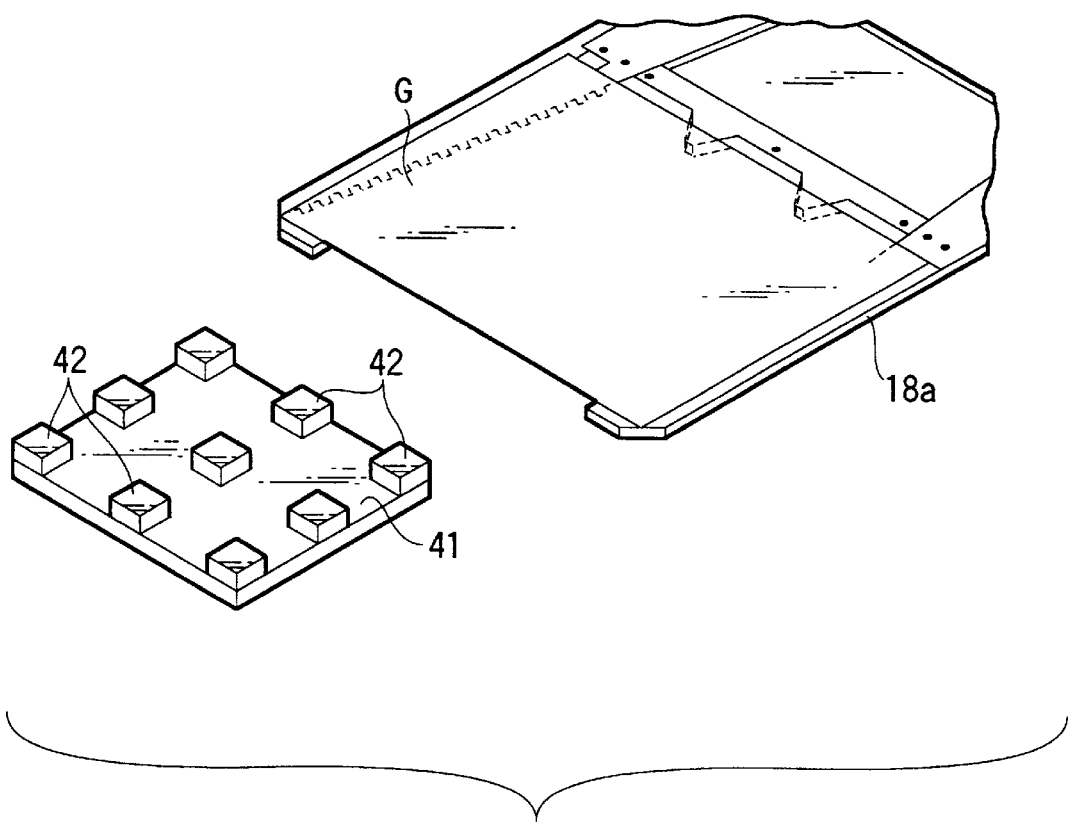
FIG. 4 is a perspective view illustrating loading/unloading of a substrate into/from the peripheral resist removing unit.

When the substrate G is loaded into the peripheral resist removing unit (ER) 23, it can be loaded into an inside of the peripheral resist removing unit (ER) 23 by an arm 18a of the main carrying unit 18, as shown in FIG. 4. Then, the loading table 41 can be lifted up by moving the piston rod 47 forth to receive the substrate G thereon, and the suction members 42 then attracts the lower surface of the substrate G. Then, the loading table 41 can be pulled down by moving the piston rod 47 back, and then the substrate G can be loaded into the peripheral resist removing unit (ER) 23.

On the contrary, when the substrate G is unloaded from the peripheral resist removing unit (ER) 23, the piston rod 47 is moved forth to lift up the loading table 41 and the substrate G up to positions 41' and G', as indicated by dot-dash lines in FIG.2, respectively. After the substrate G has been lifted up in this manner, when the free arm 18a enters into the inside of the peripheral resist removing unit (ER) 23, the loading table 41 is pulled down by moving the piston rod 47 back, so that the substrate G can be passed from the loading table 41 to the arm 18a. Then, the arm 18a goes out from the inside of the peripheral resist removing unit (ER) 23 to thus unload the substrate G.

In order to receive the solvent, the resist, etc. which are dropped down in removing the peripheral resist on the substrate G, a drain pan 50 is arranged beneath the substrate G loaded on the loading table 41. A drain pipe 51 for discharging the solvent gathered in the drain pan 50 and exhaust pipes 52 for exhausting the atmosphere in the peripheral resist removing unit (ER) 23 are connected to a bottom surface 49 of the drain pan 50. In addition, two sheets of suction plates 60, 61 are arranged vertically between the substrate G loaded on the loading table 41 and the exhaust pipes 52. Both the suction plates 60, 61 are made of punching metal, and a number of vent holes 62, 63 are formed in the suction plates 60, 61 respectively.

As shown in FIG. 3, nozzles 65, 66, 67, 68 which are moved along four sides of the rectangular substrate G respectively are arranged around the substrate G loaded on the loading table 41 (only the nozzles 65, 67 are shown in FIG. 2). In this embodiment, the nozzles 65, 67 are arranged oppositely to be moved along short sides L1, L3 of the substrate G respectively, and the nozzles 66, 68 are arranged oppositely to be moved along long sides L2, L4 of the substrate G respectively. These nozzles 65, 66, 67, 68 are attached to top ends of L-shaped moving members 70, 71, 72, 73 respectively.

As shown, guide rails 75, 76, 77, 78 are arranged so as to surround the periphery of the substrate G. These guide rails 75, 76, 77, 78 are supported respectively by supporting members 80, 81, 82, 83, 84, 85, 86, 78 which are fixed to the system frame 43. Since base sides of the moving members 70, 71, 72, 73 are fitted slidably into the guide rails 75, 76, 77, 78 respectively, the nozzles 65, 66, 67, 68 can be moved along four sides L1, L2, L3, L4 of the substrate G respectively.

Figure 5:
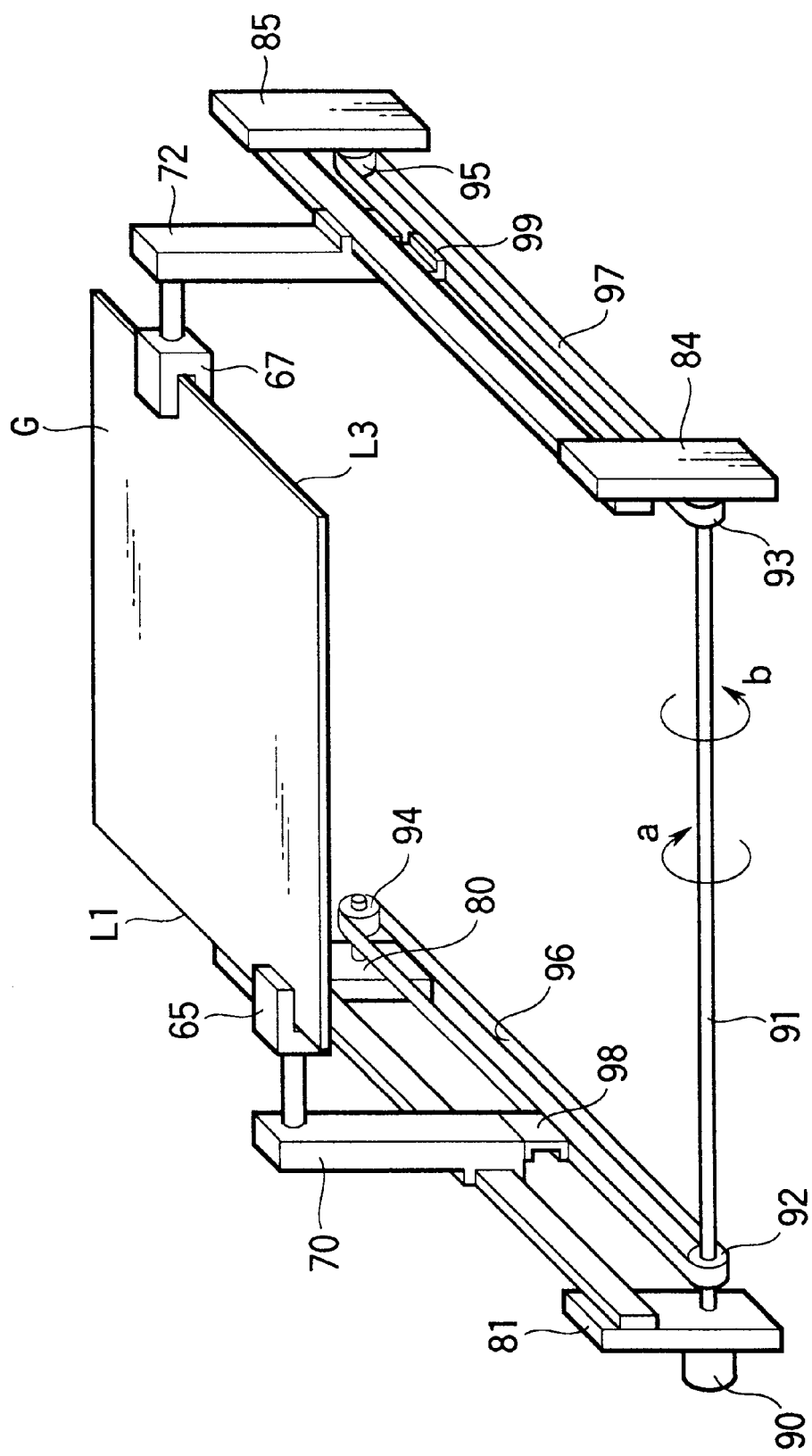
FIG. 5 is a perspective view showing a moving mechanism for moving a nozzle in the peripheral resist removing unit.

Next, according to FIGS. 2, 3 and FIG. 5, the nozzles 45, 47 moved along the short sides L1, L3 of the substrate G will be explained. A motor 90 is provided on the outside of a supporting member 81, and a driving axis 91 of the motor 90 is extended to reach a supporting member 84 which is placed to oppose to the supporting member 81. A driving pulley 92 is fitted to the driving axis 91 in the vicinity of the inside of the supporting member 81, and also a driving pulley 93 is fitted to the driving axis 91 in the vicinity of the inside of the supporting member 84. Meanwhile, a driven pulley 94 is fitted in the vicinity of the inside of the supporting member 84, and also a driven pulley 95 is fitted in the vicinity of the inside of the supporting member 85. An endless belt 96 is wound around the driving pulley 92 and the driven pulley 94, and also an endless belt 97 is wound around the driving pulley 93 and the driven pulley 95. Hence, if the motor 90 is driven, two endless belts 96, 97 can be rotated in the same direction.

Further, a moving member 70 for supporting the nozzle 65 is connected to an upper side of the endless belt 96 via a bracket 98 and also a moving member 72 for supporting the nozzle 67 is connected to a lower side of the endless belt 97 via a bracket 99. In this manner, since one moving member 70 and the other moving member 72 are moved concurrently on the upper side of the endless belt 96 and the lower side of the endless belt 97 respectively, the nozzles 65, 66 can be displaced in parallel in the opposite direction mutually according to the operation of the motor 90. More particularly, if the driving axis 91 is rotated in the clockwise direction a, for example, in FIG. 5 according to the operation of the motor 90, the nozzle 65 can be moved to the other side along the left short side L1 of the substrate G while the nozzle 67 can be moved to this side along the right short side L3 of the substrate G. Alternatively, if the driving axis 91 is rotated in the counterclockwise direction b, for example, in FIG. 5 according to the operation of the motor 90, the nozzle 65 can be moved to this side along the left short side L1 of the substrate G while the nozzle 67 can be moved to the other side along the right short side L3 of the substrate G.

Although the nozzles 65, 67 which are moved along the short sides L1, L3 of the substrate G have been explained in the above, the nozzles 66, 68 and the nozzles 65, 67 can also be moved along long sides L2, L4 of the substrate G by use of the same configuration. In other words, as shown in FIG. 3, a motor 100 is provided on the outside of a supporting member 87, and a driving axis 101 of the motor 100 is extended to reach a supporting member 82 which is placed to oppose to the supporting member 87. A driving pulley 102 is fitted to the driving axis 101 in the vicinity of the inside of the supporting member 87, and also a driving pulley 103 is fitted to the driving axis 101 in the vicinity of the inside of the supporting member 82. Meanwhile, a driven pulley 104 is fitted in the vicinity of the inside of the supporting member 86, and also a driven pulley 105 is fitted in the vicinity of the inside of the supporting member 83. An endless belt 106 is wound around the driving pulley 102 and the driven pulley 104, and also an endless belt 107 is wound around the driving pulley 103 and the driven pulley 105. Like the nozzles 65, 67 explained above, these nozzles 66, 68 are constructed such that, according to the operation of the motor 100, they can be displaced in parallel along the long sides L2, L4 of the substrate G in the opposite direction mutually.

When, as described above, the substrate G is loaded into the peripheral resist removing unit 23 or is unloaded from the peripheral resist removing unit 23 according to the vertical movement of the loading table 41, the nozzles 65, 66, 67, 68 are placed at positions away from the periphery of the substrate G, as shown in FIG. 3. Hence, there is no trouble that loading/unloading operations of the substrate G are disturbed by the presence of the nozzles 65, 66, 67, 68.

Next, configurations of the nozzles 65, 66, 67, 68 will be explained with reference to FIGS. 6 to 9 hereunder. However, since these nozzles have the same configuration, the nozzle 65 which can be moved along the short side L1 of the substrate G will be explained as the representative example.

Figure 6:
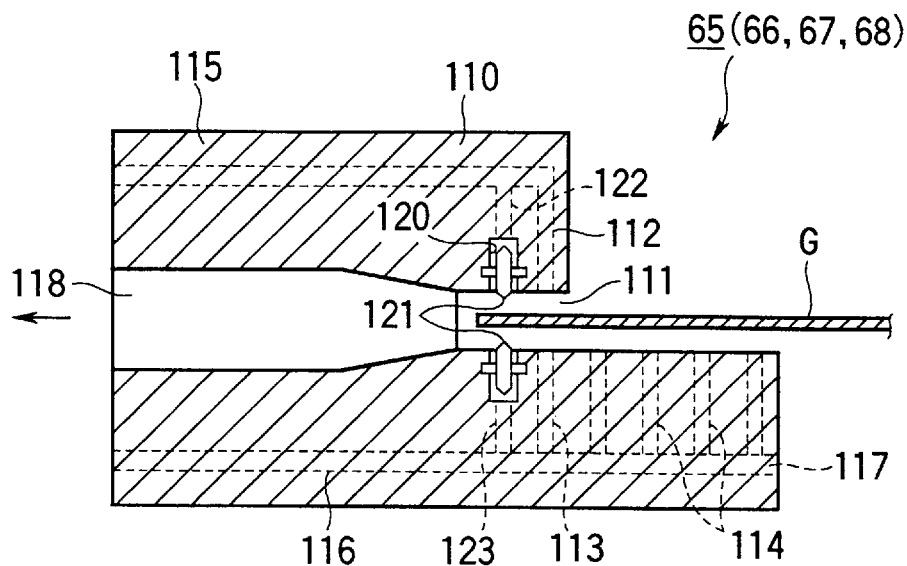
FIG. 6 is a vertical sectional view showing the nozzle in the peripheral resist removing unit.

As shown in FIG. 6, the nozzle 65 has a main body 110 and a recess portion 111 is formed on a side surface of the main body 110. The peripheral portion of the substrate G which has been held on the loading table 41 by suction is inserted into the recess portion 111 without mutual contact. That is to say, both the upper and lower surfaces of the peripheral portion of the substrate G are covered with the nozzle main body 110. Further, upper spray holes 112 for spraying the solvent for the nozzle toward the upper surface of the peripheral portion of the substrate G being inserted into the recess portion 111 and lower spray holes 113, 114 for spraying the solvent for the nozzle toward the lower surface of the peripheral portion of the substrate G are provided in the nozzle main body 110 respectively. Furthermore, a suction hole 118 is provided in the substantially central area of the nozzle main body 111. Vapor components included in the neighborhood of the peripheral portion of the substrate G in the recess portion 111 and the resist melted in the solvent, etc. are sucked via the suction hole 118 so as to be exhausted to the outside.

Figure 7:
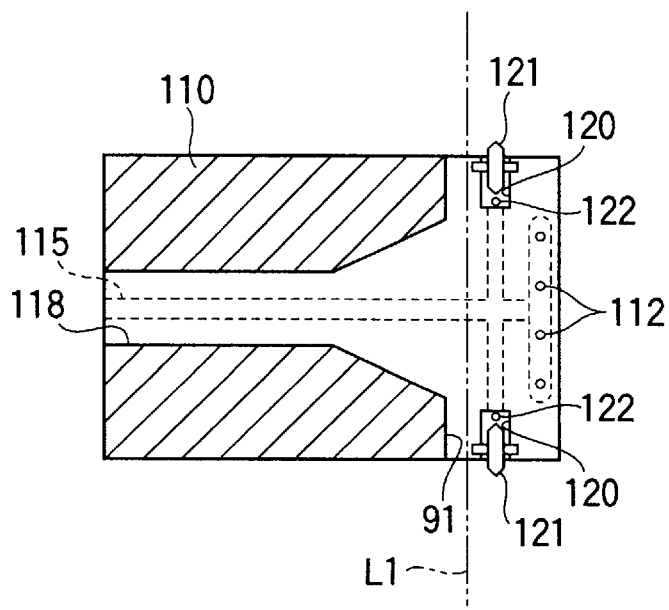
FIG. 7 is a lateral sectional view showing an upper surface of a recess portion formed in the nozzle in the peripheral resist removing unit.

As shown in FIG. 7, four upper spray holes 112 are provided on an upper surface of-the recess portion 111, and these upper spray holes 112 are formed in parallel with the short side L1 in the vicinity of the peripheral portion of the substrate G. The solvent can be supplied to the upper spray holes 112 via a liquid supply hole 115 which is passed through an upper internal area of the nozzle main body 110. The solvent is injected downward from the upper spray holes 112 to be sprayed on the upper surface of the peripheral portion of the substrate G.

Figure 8:
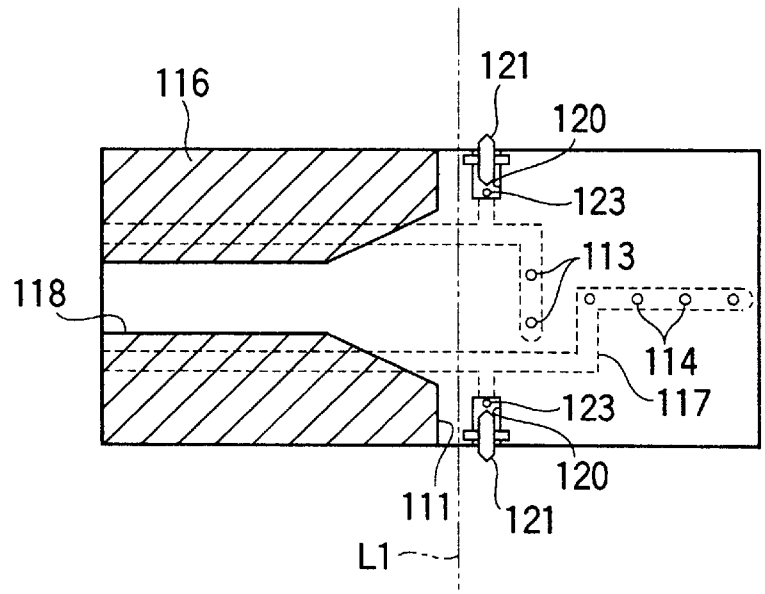
FIG. 8 is a lateral sectional view showing a lower surface of the recess portion formed in the nozzle in the peripheral resist removing unit.
Figure 9:
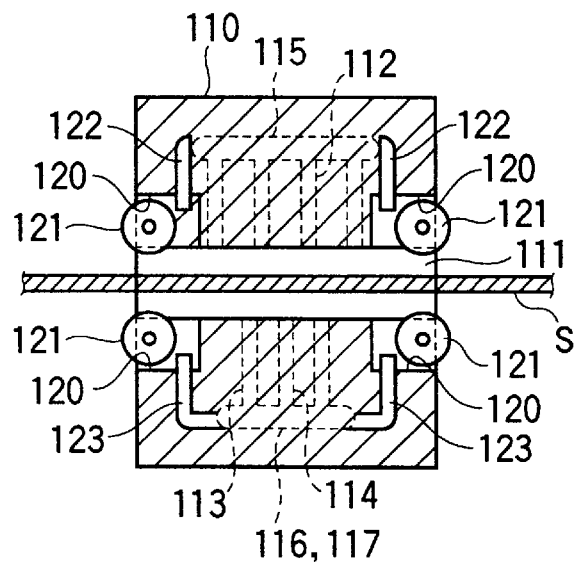
FIG. 9 is a vertical sectional view, if viewed from the substrate side, showing the nozzle in the peripheral resist removing unit.

As shown in FIG. 8, two lower spray holes 113 and four lower spray holes 114 are provided on a lower surface of the recess portion 111. The lower spray holes 113 are arranged in parallel with the short side L1 in the vicinity of the peripheral portion of the substrate G, while the lower spray holes 114 are intersected orthogonally with the short side L1 to be directed from the neighborhood of the peripheral portion of the substrate G to the inside of the substrate G. The solvent is supplied to the lower spray holes 113, 114 via liquid supply holes 116, 117 passing through a lower internal area of the nozzle main body 110 respectively. The solvent is then injected upward from the lower spray holes 113, 114 to be sprayed onto the lower surface of the peripheral portion of the substrate G.

In this embodiment, as shown in FIGS. 6 to 9, four concave portions 120 are formed on upper and lower corner portions of an inlet of the recess portion 111, and four rollers 121 are provided rotatably to the concave portions 120 respectively. These rollers 121 have such a function of guiding the peripheral portion of the substrate G toward the recess portion 111 to make easy an insertion of the substrate G into the recess portion 111 when such peripheral portion is going to enter into the inlet of the recess portion 111 even in a case where bowing of the peripheral portion of the substrate G occurs. It is preferable that a top end of a peripheral portion of the roller 121 should be formed to have a sharp edge such that a contact area between the roller 121 and the substrate G can be made as small as possible. This is because it is not preferable that normally the substrate G which has been subjected to resist coating should be brought into contact with unnecessary things and thus unnecessary contact to the substrate G should be avoided as much as possible.

Roller cleaning spray holes 122, 123 for injecting the solvent onto the rollers 121 to clean the rollers 121 are provided in the neighborhood of the rollers 121. Adhesion of the melted resist to the rollers 121 can be prevented by cleaning the rollers 121 and the solvent exerts no influence upon the substrate G. As shown in FIG. 7, on the upper side of the nozzle main body 110, the roller cleaning spray holes 122 are branched off from the liquid supply hole 115 for supplying the solvent. As shown in FIG. 8, on the lower side of the nozzle main body 110, the roller cleaning spray holes 123 are branched off from the liquid supply holes 116, 117 respectively. Preferably these roller cleaning spray holes 122, 123 should be placed close to the short side L1 of the substrate G rather than the upper and lower spray holes 112, 113, 114 which are used to melt the resist. As a result, an influence of the solvent used to clean the rollers 121 upon the substrate G can be prevented.

Next, a process step in the peripheral resist removing unit (ER) 23 will be explained hereunder.

The substrate G on which the resist has been coated in the resist coating process unit (CT) 22 as described above is loaded into the peripheral resist removing unit (ER) 23. As shown in FIG. 3, upon such loading of the substrate G, all the nozzles 65, 66, 67, 68 are retreated to positions away from the periphery of the substrate G. As shown in FIG. 4, the substrate G which has been loaded into the peripheral resist removing unit (ER) 23 by the arms 18a of the main carrying system 18 is received on the upper surface of the loading table 41 according to the above-mentioned procedures. After this reception, when the free arm 18a goes out from the peripheral resist removing unit (ER) 23, the loading table 41 is descended and then the substrate G is loaded into the peripheral resist removing unit (ER) 23.

Subsequently, the nozzles 65, 66, 67, 68 start to move along four sides L1, L2, L3, L4 of the substrate G according to operations of the motors 90, 100 respectively. At this time, in this embodiment, as shown in FIGS. 6 to 9, since four rollers 121 are provided rotatably to upper and lower corner portions of an inlet of the recess portion 111 of the nozzle main body 110 respectively, the peripheral portion of the substrate G can be guided toward the recess portion 111 by these rollers 121 and thus the peripheral portion of the substrate G can be easily inserted into the recess portion 111 when such peripheral portion is going to enter into the inlet of the recess portion 111 even if the bowing of the peripheral portion of the substrate G occurs. For instance, in the event that the bowing of about 5 mm in width has occurred in the substrate of 550 mm×650 mm, unless no roller 121 is provided, there is a possibility that the peripheral portion of the substrate G cannot be inserted into the recess portion 111 since a width of the recess portion 111 is set to about 3.5 to 4.5 mm. However, the peripheral portion of the substrate G is guided into the recess portion 111 by providing the rollers 121 even if such peripheral portion gets out of the width of the recess portion 111.

If the peripheral portion of the substrate G has been inserted into the recess portions 111 of the nozzles 65, 66, 67, 68 without their mutual contact, the solvent is injected from the upper and lower spray holes 112, 113, 114 and the roller cleaning spray holes 122, 123 and sucked by the suction hole 118 to be exhausted. Therefore, unnecessary resist which has been adhered to the peripheral portion of the substrate G can be melted by the solvent and then removed therefrom.

After the undesired resist which has been adhered to the peripheral portion of the substrate G has been removed in this fashion, the loading table 41 is lifted up and then the arm 18a of the main carrying unit 18 receives the substrate G, so that the substrate G can be unloaded from the peripheral resist removing unit (ER) 23. In this unloading, as shown in FIG. 3, all the nozzles 65, 66, 67, 68 are retreated to their positions away from the periphery of the substrate G.

After the processes in the peripheral resist removing unit (ER) 23 have been completed like the above, the resist film on the substrate G is subjected to the exposure process in the exposure unit (not shown) as described above and is then subjected to the developing process in any of the developing process units (DEVs) 24a, 24b, 24c.

Next, another embodiment of the present invention will be explained hereunder.

Figure 10:
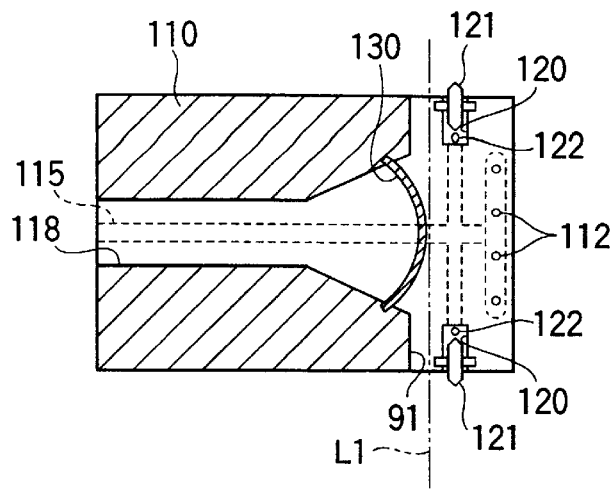
FIG. 10 is a lateral sectional view showing an upper surface of a recess portion formed in a nozzle in a peripheral resist removing unit according to another embodiment of the processing apparatus of the present invention.

This embodiment is different from the above embodiment in that a removing member for scraping off the resist adhered to the peripheral portion of the substrate G is provided to nozzles 65, 66, 67, 68. In other words, as shown in FIG. 10 which is a lateral sectional view showing an upper surface of a recess portion 91, a removing member 130 made up of a plate spring which is caused to contact to the end surface of the substrate G is secured to the nozzle main body 90. Accordingly, the resist which has been still adhered to the peripheral portion of the substrate G though the solvent is supplied thereto can be scraped off. The removing member 130 is formed to have an arc shape which projects to the substrate G side to apply an energizing force to the end surface of the substrate G. Accordingly, the removing member 130 can always push the end surface of the substrate G such that the resist which has been adhered to the peripheral portion of the substrate G can be surely removed by the removing member 130. Moreover, an excessive force can not be applied to the substrate by its spring effect, so that the removing member 130 can come uniformly into contact with the end portion of the substrate G without displacement of the substrate G which has been positioned and held.

Figure 11A:
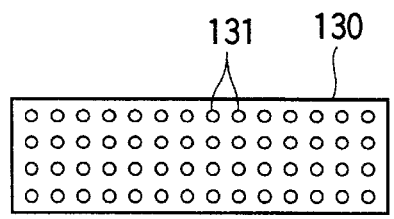
FIGS. 11A to 11C are schematic views showing a removing member used in the nozzle shown in FIG. 10.
Figure 11B:
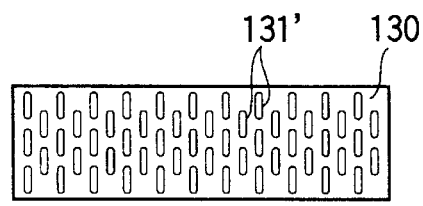
Figure 11C:
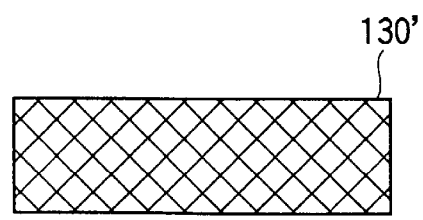

In addition, the removing member 130 made of the plate spring can be formed by a mere plate member. However, it is preferable that a plate on a surface of which a number of holes are formed should be employed. For example, a plate having a number of circular holes 131 thereon as shown in FIG. 11A or a plate having a number of narrow holes 131' as shown in FIG. 11B may be employed, otherwise a removing member 130' formed like a mesh structure as shown in FIG. 11C may be employed. According to such structure, the resist can be removed effectively by the holed portions of the surface, and the resist can be prevented from being deposited on the plate spring, etc. by sucking the solvent and the resist via the holes.

Figure 12:
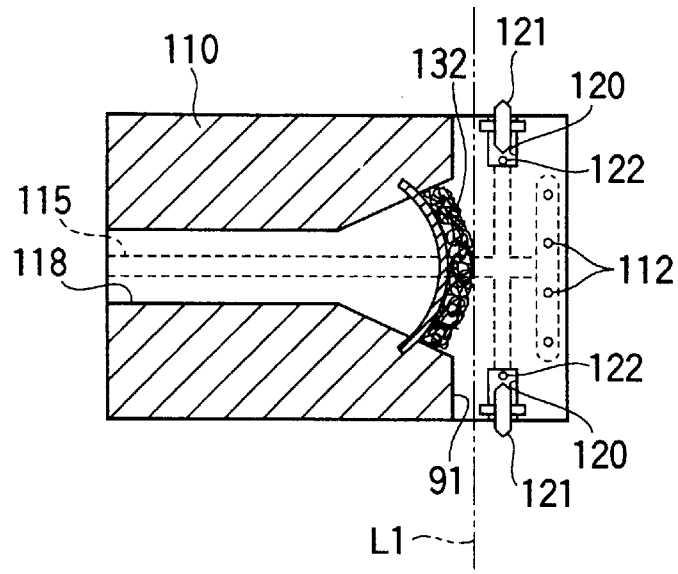
FIG. 12 is a lateral sectional view showing an upper surface of the recess portion formed in the nozzle in the peripheral resist removing unit which uses another removing member.

Besides, as shown in FIG. 12, a removing member 132 using an aggregate of metal wires may be provided. In this case, such aggregate of metal wires can act as a metal scrubbing brush, so that the resist liquid which has been adhered to the peripheral portion of the substrate G can be scraped off effectively by the concave portion of the metal wires.

Figure 13:
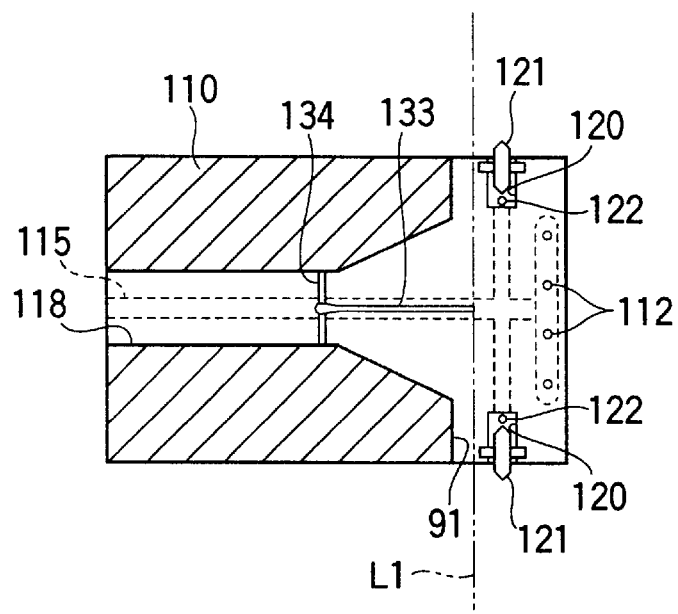
FIG. 13 is a lateral sectional view showing an upper surface of the recess portion formed in the nozzle in the peripheral resist removing unit which uses still another removing member.
Figure 14:
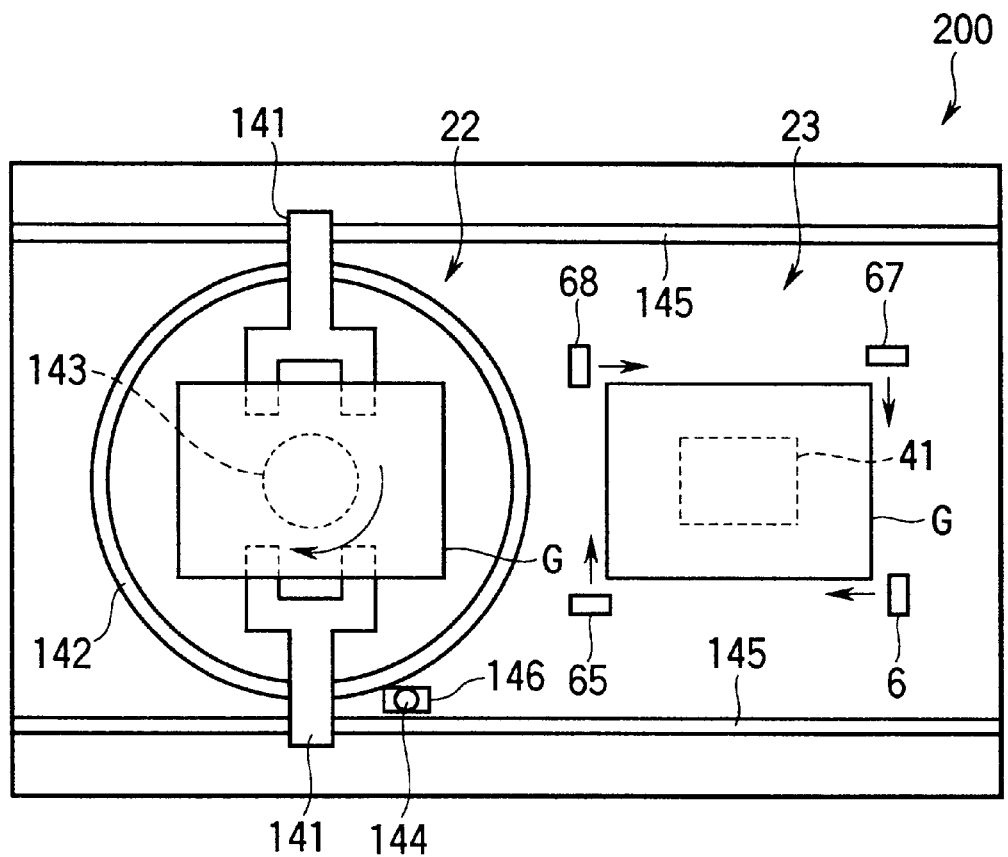
FIG. 14 is a plan view showing a unit into which a resist coating unit and a peripheral resist removing unit are incorporated.

Still more, as shown in FIG. 13, a removing member 133 made of the plate spring may be supported by a supporting member 134 such that a longitudinal direction of the removing member 133 is positioned perpendicularly to the end surface of the substrate G so as to remove the resist, which has adhered to the substrate G, by the edge portion of the removing member 133.

The present invention is not limited to the above embodiments, and thus can be modified variously in the range not departing from a scope of the present invention.

For instance, as shown in FIG. 13, a resist coating unit (CT) 22' and a peripheral resist removing unit (ER) 23' may be incorporated adjacently into the same unit 200 such that the substrate G can be carried between the resist coating unit 22' and the peripheral resist removing unit 23'. The resist coating unit 22' shown herein can supply the resist by moving a resist nozzle 144 over a central area of the substrate G which has been held in a cup 142 by being sucked by means of a spin chuck 143, and then coat the resist on an overall surface of the substrate G by virtue of a centrifugal force which can be obtained by rotating the substrate G. The substrate G is sandwiched by arms 141 after the coating has been completed and then carried into the peripheral resist removing unit 23' by moving the arms 141 along rails 145. The resist which has been adhered to the peripheral portion of the substrate G can be removed by the peripheral resist removing unit 23', like the above peripheral resist removing unit 23.

In this manner, if the resist coating unit 22' and the peripheral resist removing unit 23' are incorporated adjacently into the same unit 200 such that the substrate G can be carried therebetween by the carrying arms 141, a carry operation of the main carrying mechanism 18 can be simplified and therefore a throughput can be improved.

Further, an example has been shown wherein the rollers are employed as the guiding means, but the guiding means is not limited to this. Other rotating body such as a ball may be preferably employed, and further the guiding means is not limited the rotating body. Furthermore, any member may be employed as the removing member if it is able to scrape off the processing agent such as the resist when it is brought into contact with the end surface of the substrate, and therefore its construction and placement are not restricted. In addition, the case where the resist adhered to the peripheral portion of the substrate should be removed has been discussed in the above embodiments, but the present invention is not limited to the resist and may be applied to the case where other processing agent should be removed.

What is claimed is:

1. A processing apparatus for removing a processing agent adhered to a peripheral portion of a substrate on which the processing agent is coated, comprising:

a nozzle having a recess portion into which the peripheral portion of the substrate is inserted, and for supplying a solvent to the peripheral portion of the substrate which has been inserted into the recess portion;

a moving mechanism for moving the nozzle along the peripheral portion of the substrate; and a guiding means for guiding the peripheral portion of the substrate to an inlet of the recess portion of the nozzle, whereby the processing agent on the peripheral portion of the substrate can be removed by the solvent which has been supplied to the peripheral portion of the substrate wherein the guiding means has rotating bodies arranged on the inlet of the recess portion.

2. The processing apparatus according to claim 1, wherein the rotating bodies are made up of rollers.

3. The processing apparatus according to claim 1, further comprising a cleaning means provided near the rotating bodies, for cleaning the rotating bodies by supplying the solvent thereto.

4. The processing apparatus according to claim 1, wherein the nozzle includes solvent injection holes for injecting the solvent onto upper and lower surfaces of the substrate.

5. The processing apparatus according to claim 1, further comprising a sucking means for sucking the processing agent melted by the solvent near the peripheral portion of the substrate.

6. The processing apparatus for removing a processing agent adhered to an peripheral portion of a substrate on which the processing agent is coated, comprising:

a nozzle having a recess portion into which the peripheral portion of the substrate is inserted, and for supplying a solvent to the peripheral portion of the substrate which has been inserted into the recess portion;

a moving mechanism for moving the nozzle along the peripheral portion of the substrate; and a removing means provided in the recess portion of the nozzle, for scraping off the processing agent which is adhered to an end surface and its neighboring area of the substrate when it is brought into contact with the end surface of the substrate.

7. The processing apparatus according to claim 6, wherein the removing means has a plate spring which can apply an energizing force when the end surface of the substrate comes into contact with the removing means.

8. The processing apparatus according to claim 7, wherein a number of holes are formed on a surface of the plate spring.

9. The processing apparatus according to claim 6, wherein the removing means is made up of an aggregate of metal wires.

10. The processing apparatus according to claim 6, further comprising a guiding means for guiding the peripheral portion of the substrate to an inlet of the recess portion of the nozzle.

11. The processing apparatus according to claim 10, wherein the guiding means has rotating bodies arranged on the inlet of the recess portion.

12. The processing apparatus according to claim 11, wherein the rotating bodies are made up of rollers.

13. The processing apparatus according to claim 11, further comprising a cleaning means provided near the rotating bodies, for cleaning the rotating bodies by supplying the solvent thereto.

14. The processing apparatus according to claim 6, wherein the nozzle includes solvent injection holes for injecting the solvent onto upper and lower surfaces of the substrate.

15. The processing apparatus according to claim 6, further comprising a sucking means for sucking the processing agent melted by the solvent near the peripheral portion of the substrate.

* * * * *

UNITED STATES PATENT AND TRADEMARK OFFICE
CERTIFICATE OF CORRECTION

PATENT NO. : 6,062,288
DATED : May 16, 2000
INVENTOR(S) : Kiyohisa Tateyama

It is certified that error appears in the above-identified patent and that said Letters Patent is hereby corrected as shown below:

Column 2,
Lines 19-21, "As a result, it is evident that vacuum suction extending up to the periperal portion of the substrate would not preferable" should read -- As a result, it is evident that vacuum suction extending up to peripheral portion of the substrate would not be preferable --

Column 3,
Line 37, replace "substrate without displacement of" with -- substrate by its spring effect, so that the removing member can come uniformly into contact with the end portion of the substrate without displacement of --

Column 6,
Line 21, replace "with the resist in- the-" with -- with the resist in the --

Column 9,
Line 11, replace "upper surface of- the-" with -- upper surface of the --.

Signed and Sealed this

Twenty-fourth Day of August, 2004

JON W. DUDAS
*Director of the United States Patent and Trademark Office*